United States Patent [19]
Tsukiji

[11] Patent Number: 5,841,693
[45] Date of Patent: Nov. 24, 1998

[54] NON-VOLATILE MEMORY USING FIELD EFFECT TRANSISTORS HAVING DUAL FLOATING GATES FOR STORING TWO BITS PER CELL

[75] Inventor: Masaru Tsukiji, Tokyo, Japan

[73] Assignee: NEC Corporation, Tokyo, Japan

[21] Appl. No.: 840,698

[22] Filed: Apr. 25, 1997

[30] Foreign Application Priority Data

Apr. 25, 1996 [JP] Japan ................... 8-105222

[51] Int. Cl.$^6$ ................... G11C 16/04

[52] U.S. Cl. ................... 365/185.01; 365/185.03; 365/185.18; 257/315

[58] Field of Search ................... 365/185.01, 185.03, 365/185.18; 257/316, 315

[56] References Cited

U.S. PATENT DOCUMENTS

| | | | |
|---|---|---|---|
| 4,380,057 | 4/1983 | Kotecha et al. | 257/316 |
| 5,021,999 | 6/1991 | Kohda et al. | 365/185.03 |
| 5,159,570 | 10/1992 | Mitchell et al. | 365/185.03 |
| 5,674,768 | 10/1997 | Chang et al. | 437/43 |

OTHER PUBLICATIONS

M. Bauer et al.; "A Multilevel–Cell 32Mb Flash Memory"; 1995 IEEE International Solid–State Circuits Conference, Session 7, Flash Memory, Paper TA 7.7, pp. 132–133.

Primary Examiner—David Nelms
Assistant Examiner—Huan Hoang
Attorney, Agent, or Firm—Whitham, Curtis & Whitham

[57] ABSTRACT

For each memory cell of a non-volatile memory, first and second semiconductor regions are provided in a substrate to serve as a source and a drain respectively and a channel region is formed therebetween. On different areas of the channel region are provided first and second floating gates, on which a control gate is formed. Third and fourth semiconductor regions of the same conductivity type as that of the substrate are respectively located below the first and second floating gates and respectively adjacent the drain and source regions. The impurity concentration of the third and fourth semiconductor regions is higher than that of the substrate. A high electric field is produced by the third semiconductor region when the first and second semiconductor regions are biased at a first potential difference for trapping hot electrons into the first floating gate, and a high electric field is produced by the fourth semiconductor region when the first and second semiconductor regions are biased at a second potential difference opposite in sense to the first potential difference for trapping hot electrons into the second floating gate.

20 Claims, 5 Drawing Sheets

FIG. 6
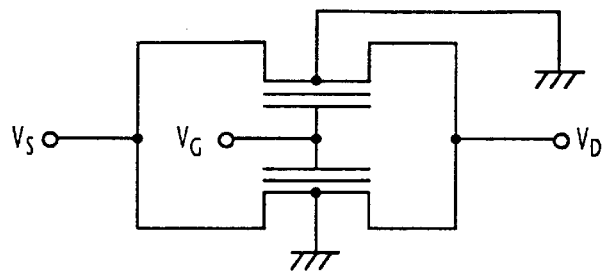
FIG. 7
| | WRITE (volts) | | READ (volts) |
|---|---|---|---|
| | FLOATING GATE 3A | FLOATING GATE 3B | |
| $V_G$ | 10 | 10 | 3 |
| $V_S$ | 0 | 3 | 0 |
| $V_D$ | 2 | 0 | 1 |
FIG. 8
| NORMALIZED CHARGE (3A) | 0 | 1 | 0 | 1 |
|---|---|---|---|---|
| NORMALIZED CHARGE (3B) | 0 | 0 | 2 | 2 |
| BINARY OUTPUT | "00" | "01" | "10" | "11" |
FIG. 9
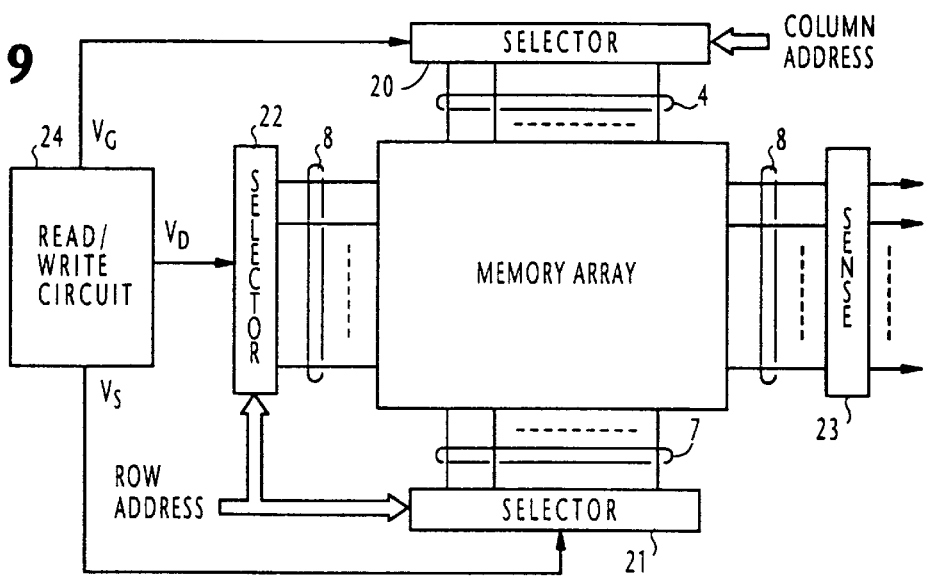
FIG. 10
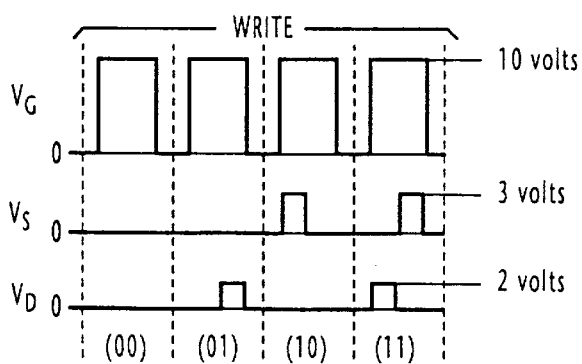

FIG. 11
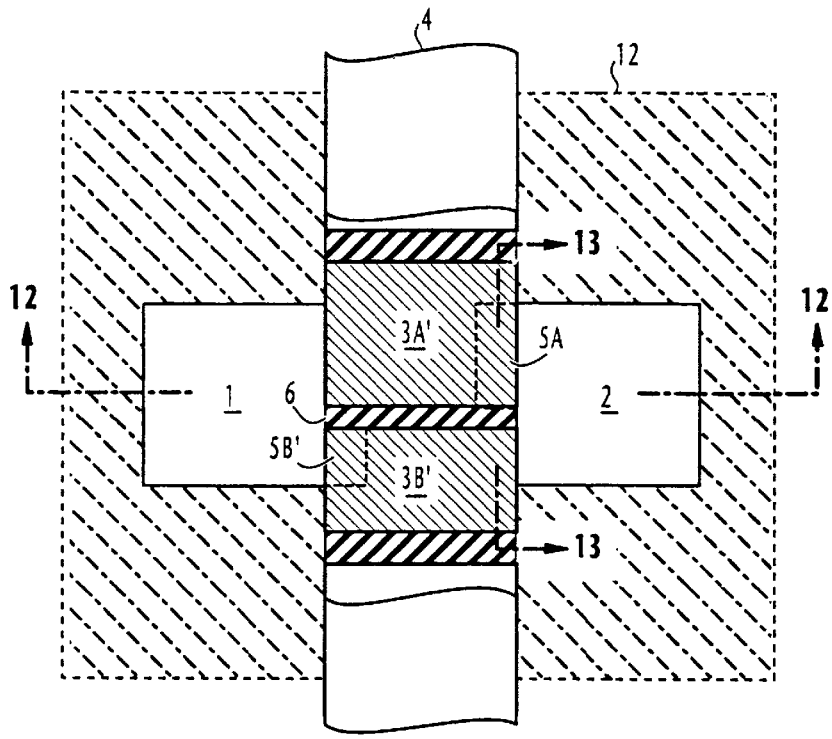
FIG. 12
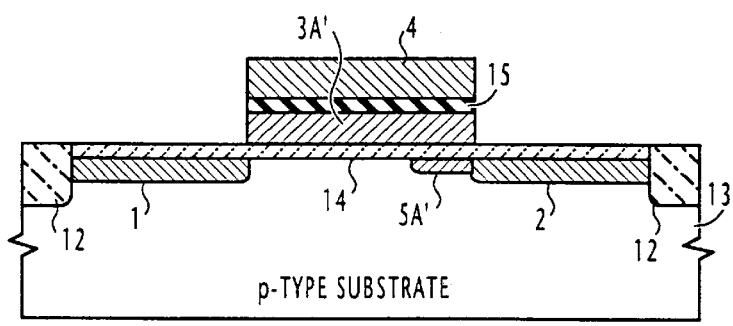
FIG. 13
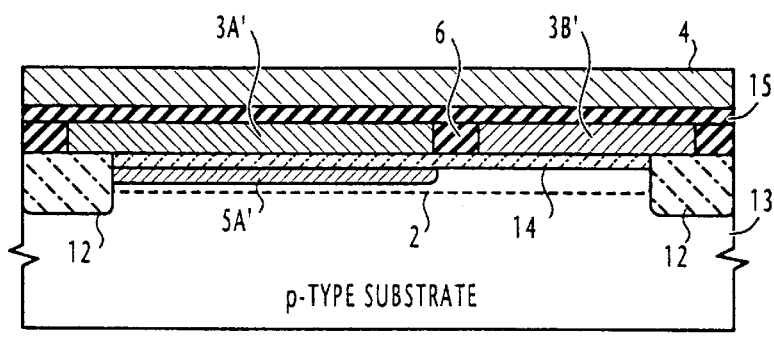
FIG. 14
| | WRITE (volts) | | READ (volts) |
|---|---|---|---|
| | FLOATING GATE 3A | FLOATING GATE 3B | |
| $V_G$ | 10 | 10 | 3 |
| $V_S$ | 0 | 2 | 0 |
| $V_D$ | 2 | 0 | 1 | ns
NON-VOLATILE MEMORY USING FIELD EFFECT TRANSISTORS HAVING DUAL FLOATING GATES FOR STORING TWO BITS PER CELL

BACKGROUND OF THE INVENTION

1. Field of the Invention

The present invention generally relates to non-volatile memories, and more particularly to a non-volatile memory wherein each memory cell is capable of storing a multi-bit symbol.

2. Description of the Related Art

Conventional non-volatile memories are one-bit per cell memories. Due to the need for memories capable of storing a greater number of bits per unit area, the development effort has been focused on the implementation of memories with a higher level of integration. However, the packing density of the current technology is approaching a point which cannot easily be overcome without some technical breakthrough. As a solution to this problem, a non-volatile memory of multilevel storage capability is discussed in a paper "A Multilevel-Cell 32 Mb Flash Memory", M. Bauer et al., ISSCC95/Session 7/Flash Memory/Paper TA7.7 (1995 IEEE International Solid-State Circuits Conference). According to this prior art, storage of two bits per cell using four possible states of a single-floating gate field effect transistor is achieved by defining four threshold voltage ranges.

However, because of the single floating gate structure and the arrow threshold ranges, the amount of hot electrons trapped into the floating gate must be precisely controlled.

SUMMARY OF THE INVENTION

It is therefore an object of the present invention to provide a two-bit per cell field effect transistor and a non-volatile memory using the transistor that relaxes the voltage control requirements for trapping hot electrons.

According to the present invention, there is provided a field effect transistor comprising a semiconductor substrate of first conductivity type, first and second semiconductor regions in the substrate, the first and second semiconductor regions have second conductivity type opposite to the first conductivity type and being arranged to form a channel region therebetween, first and second floating gates on different areas of the channel region, and a control gate on the first and second floating gates. A first insulating layer is disposed between the channel region and the first and second floating gates and a second insulating layer is disposed between the first and second floating gates and the control gate. Third and fourth semiconductor regions are respectively located below the first and second floating gates for producing a first electric field adjacent the first floating gate when the first and second semiconductor regions are biased at a first potential difference and producing a second electric field adjacent the second floating gate when the first and second semiconductor regions are biased at a second potential difference inverse to the first potential difference.

Preferably, the third semiconductor region is of the first conductivity type and located in the channel region adjacent the second semiconductor region, and the fourth semiconductor region is of the first conductivity type and located in the channel region adjacent the first semiconductor region, and wherein impurity concentration of the third and fourth semiconductor regions is higher than impurity concentration of the substrate.

The amount of electrons trapped in the first floating gate under the influence of the first electric field is different from the amount of electrons trapped in the second floating gate under the influence of the second electric field.

BRIEF DESCRIPTION OF THE DRAWINGS

The present invention will be described in further detail with reference to the accompanying drawings, in which:

FIG. 6 is an illustration of an equivalent circuit of a memory cell of the present invention;

FIG. 7 is a tabulation of voltages applied to each memory of the first embodiment during write and read operations;

FIG. 8 is a tabulation of normalized charges trapped in respective floating gates of a memory cell for corresponding binary outputs;

FIG. 9 is a block diagram of the non-volatile memory array with associated peripheral circuitry;

FIG. 10 is a timing diagram of the read/write circuit during write modes;

FIG. 11 is a plan view of a non-volatile memory according to a second embodiment of the present invention;

FIGS. 12 and 13 are cross-sectional views taken along the lines 12 and 13 of FIG. 11, respectively;

FIG. 14 is a tabulation of voltages applied to each memory of the second embodiment during write and read operations;

DETAILED DESCRIPTION

Figure 1:
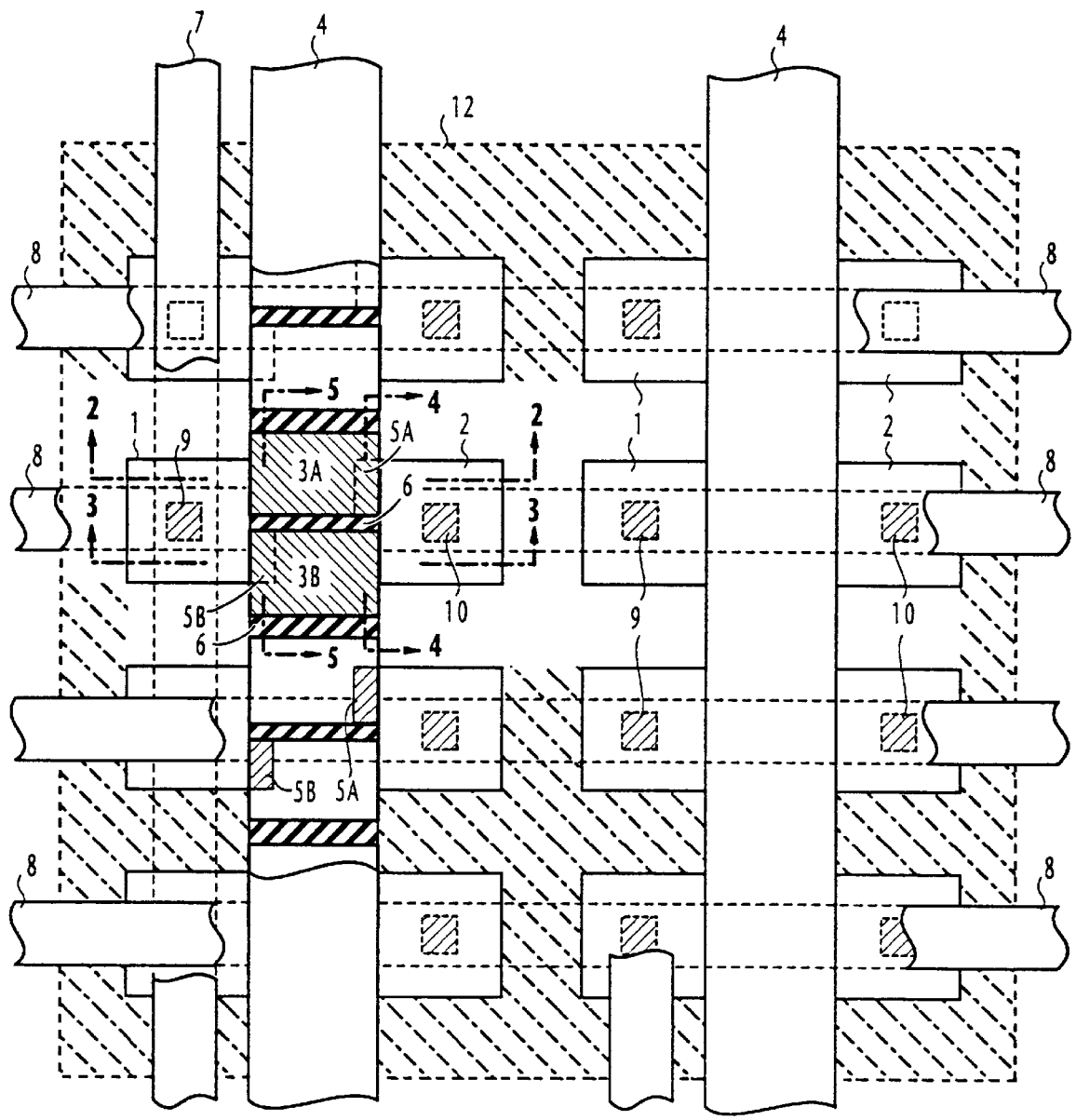
FIG. 1 is a plan view a non-volatile memory according to a first embodiment of the present invention.
Figure 2:
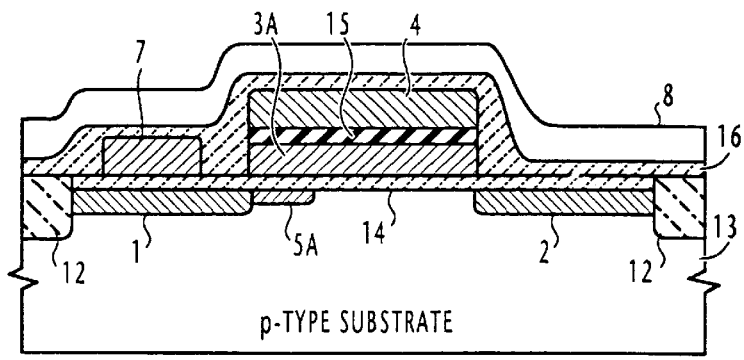
FIGS. 2, 3, 4 and 5 are cross-sectional views taken along the lines 2, 3, 4 and 5 of FIG. 1, respectively.
Figure 3:
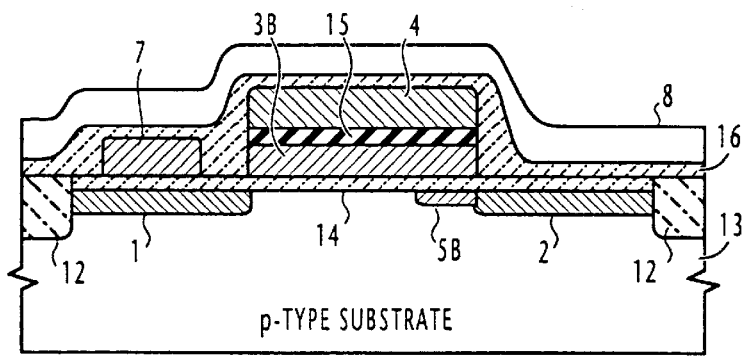
Figure 4:
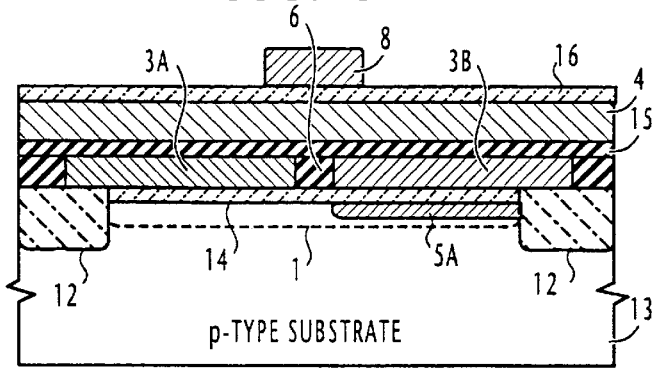
Figure 5:
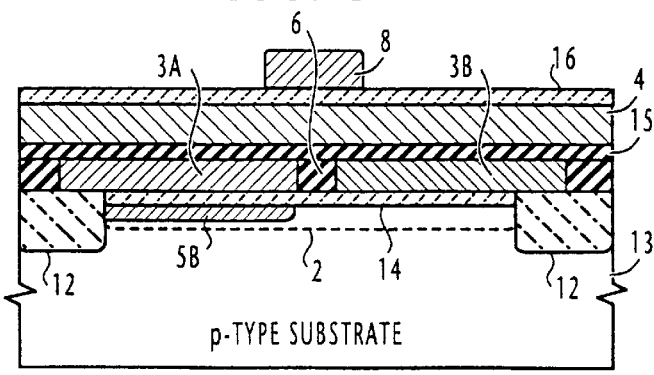

In FIGS. 1 to 5, there is shown a non-volatile semiconductor memory according to a first embodiment of the present invention. The memory comprises a plurality of memory cells arranged in a matrix array of rows and columns on a semiconductor substrate 13 of p-type conductivity. Each memory cell is a field-effect transistor with an embedded floating gate. The floating-gate field-effect transistor is implemented with a pair of diffused regions 1 and 2 of n-type conductivity to serve as the source and drain of the transistor, forming a channel region therebetween. Each memory cell is isolated from other cells by channel stopper 12 and a silicon dioxide layer 14 is deposited on the source and drain regions as well as on the channel region. The channel region is equally divided by insulator 6 into two areas on which floating gates 3A and 3B are respectively formed. The insulating layer 14 of each memory cell is etched to provide a hole 9 that opens to the underlying source region 1 and conductive material is deposited on the insulating layer 14 to form common source electrodes 7 so that each source electrode 7 makes ohmic contact through holes 9 with the source regions 1 of the memory cells arranged in a column of the matrix array.

Before the insulating layer 14 is deposited, a $p^+$-type diffused region 5A is formed by diffusing impurities of the same conductivity type as the substrate with a concentration higher than that of the substrate in a portion of the channel region below the floating gate 3A and where minority carrier leaves the channel region and enters the drain region 2.

Likewise, a p+-type diffused region 5B is formed in a portion of the channel region which is below the floating gate 3B and where minority carrier leaves the source region 1 and enters the channel region. Each of the diffused regions 5A, 5B has a thickness smaller than the thickness of the source and drain regions.

The floating gates 3A and 3B are coated with an insulating layer 15 which is a composite of substances such as silicon dioxide and silicon nitride. On the insulating layer 15 is formed metal regions which extend columnwise to serve as the common control gates 4 each for the memory cells of the same column. The device is then coated with an insulating layer 16. Layers 14 and 16 are then etched to provide holes 10 that open to the underlying drain regions 2 and conductive material is deposited to form common drain electrodes 8 so that each of the common drain electrodes makes ohmic contact through holes 10 with the drain regions 2 of the memory cells arranged in a row of the matrix array.

As is well known, the control gates 4, source electrodes 7 and drain electrodes 8 are connected to address circuitry, not shown, for write, erase and read operations.

The p+-type diff-used region 5A of each memory cell has the effect of producing a high electric field when the drain region 2 of the cell is biased at a higher potential than the source region 1 for trapping hot electrons in the floating gate 3A. In a similar manner, the p+-type diffused region 5B produces a high electric field when the source region 1 is biased at a higher potential than the drain region 2 for trapping hot electrons in the floating gate 3B.

An equivalent circuit of each memory cell is shown in FIG. 6. The memory cell comprises two transistors with their sources connected together to a terminal $V_S$ and their drains are connected together to a terminal $V_D$ and their control gates connected together to a terminal $V_G$. It is seen that each memory cell has two floating gates isolated from each other .For trapping different amounts of hot electrons.

According to the first embodiment, different amounts of hot electrons are trapped in a memory cell when a voltage reversal occurs at the source and drain of the cell using different potentials.

As shown in FIG. 7, when trapping hot electrons into the floating gate 3A of a memory cell, terminals $V_G$, $V_S$ and $V_D$ are respectively supplied with potentials of 10, 0 and 2 volts. A greater amount of hot electrons are trapped into the floating gate 3B of the memory cell by supplying potentials of 20, 3 and 0 volts to terminals $V_G$, $V_S$ and $V_D$, respectively. The memory cell of this invention is erased in the same manner as the conventional single floating gate transistor is erased. When reading the memory cell, potentials of 3, 0 and 1 volts are applied respectively to terminals $V_G$, $V_S$ and $V_D$.

When hot electrons are trapped in the floating gates 3A and 3B in a manner as described above, charges of normalized values "1" and "2" are respectively stored in floating gates 3A and 3B, and when no hot electrons are trapped in these gates it can be said that they store a charge of normalized value "0". As a result, the floating gate 3A assumes one of discrete values "0" and "1" while the floating gate 3B assumes one of discrete values "0" and "2".

It follows that the reading of each memory cell results in the generation of an output voltage which is a sum of normalized values of charges trapped in the floating gates 3A and 3B of the memory cell. As shown in FIG. 8, the memory cell has one of four possible sums of normalized analog values, i.e., 0, 1, 2 and 3, which can be used to represent binary outputs "00", "01", "10" and "11", respectively.

FIG. 9 shows a block diagram of peripheral circuits of the non-volatile memory array. The control gate electrodes 4 of the memory array are connected to a column selector 20 and the source electrodes 7 are connected to a row selector 21. The drain electrodes 8 of the array are connected to a row selector 22 and a sense amplifier 23. A read/write circuit 24 supplies a control-gate voltages $V_G$, a source voltage $V_S$ and a drain voltage $V_D$ to selectors 20, 21 and 22, respectively. It is seen that with the control gate 4 of a memory cell being selected, both of the source and drain regions 1 and 2 of the cell are independently accessed from the read/write circuit 24 via selectors 21, 22 for programming the matrix array.

As shown in FIG. 10, for programming (i.e., writing) symbols "01" and "10", hot electrons are trapped into only one of the floating gates. Therefore, a 0-volt source voltage and a 2-volt drain voltage pulse are applied to a memory cell for programming a symbol "01", and a 3-volt source voltage pulse and a 0-volt drain voltage are supplied for programming a symbol "10". The source and drain regions 1 and 2 are therefore biased only once at the 2-volt potential difference in the case of symbol "01", and biased only once at the 3-volt potential difference of opposite polarity to the 2-volt potential difference in the case of symbol "10". For programming a symbol "00", the source and drain regions of the selected cell are biased at the 0-volt reference potential.

When programming a symbol "11", the read/write circuit 24 supplies a 2-volt drain voltage pulse ($V_D$) and a 3-volt source voltage pulse ($V_S$) to a selected cell in sequence and a 10-voltage control gate voltage pulse ($V_G$) to the cell at the same time, since hot electrons must be respectively trapped into the floating gates 3A, 3B of the cell. In this case, the source and drain regions 1 and 2 are biased at a first 2-volt potential difference and then at a second 3-volt potential difference opposite in sense to the first 2-volt potential difference.

During a read mode, the read/write circuit 24 supplies a 3-volt control gate voltage pulse, a zero source voltage and a 1-volt drain voltage to a selected memory cell to read a stored symbol which assumes on, of four discrete voltages. The voltage output read from the selected memory cell is detected by the sense amplifier 23 and supplied to utilization circuitry, not shown.

In the first embodiment, the discrete output voltages are produced by the application of opposite potential differences of different magnitudes (i.e., 2 and 3 volts) to floating gates of equal size. The discrete output voltages may also be produced by the application of equal potential differences to floating gates of different size. For this purpose, each memory cell of the second embodiment of this invention has floating gates of difference size to provide different abilities to store electrons. As shown in FIGS. 11 to 13, the effective area of floating gate 3A' is greater than that of floating gate 3B'. In addition, the p+-type diffused regions 5A' and 5B' have different sizes respectively corresponding to the effective sizes of the floating gates 3A' and 3B'.

Because of the different electron trapping capabilities, the same potential differences (2 volts) of opposite polarity are supplied to terminals $V_S$ and $V_D$ for trapping different amounts of hot electrons into floating gates 3A' and 3B' (see FIG. 14).

Figure 15:
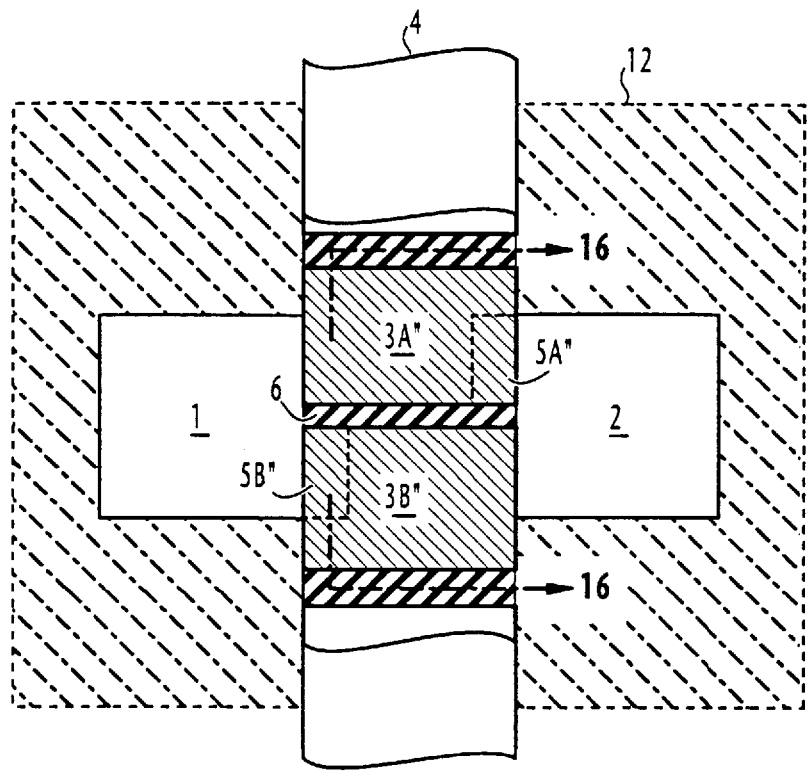
FIG. 15 is a plan view a non-volatile memory according to a third embodiment of the present invention.
Figure 16:
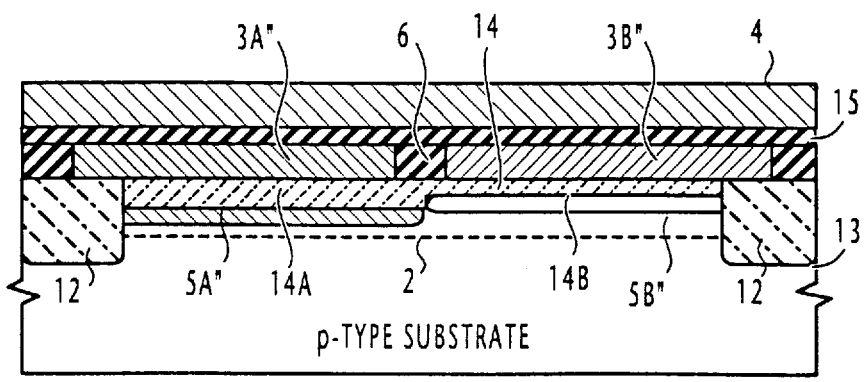
FIG. 16 is a cross-sectional views taken along the line 16 of FIG. 15.

As an alternative form of the second embodiment, the different electron trapping capabilities of floating gates are implemented by different thicknesses of the portions of the insulating layer 14 which are immediately below the floating gates. As shown in FIGS. 15 and 16, each memory cell of the alternative form has floating gates 3A" and 3B" of equal size and p+-type diffused regions 5A" and 5B" of equal size. The portions of the insulating layer 14 which are immediately below the floating gates 3A" and 3B" are respectively designated 14A and 14B. It is seen that the layer portion 14A has a greater thickness than that of the layer portion 14B, so that portion 14A has a greater ability to capture hot electrons produced by the p-type diffused region 5A" than the ability of portion 14B to capture hot electrons produced by the $p^+$-type diffused region 5B".

What is claimed is:

1. A field-effect transistor comprising:
   a semiconductor substrate of a first conductivity type;
   first and second semiconductor regions in said substrate, the first and second semiconductor regions having a second conductivity type opposite to the first conductivity type and being arranged to form a channel region extending in a channel direction therebetween;
   first and second floating gates formed above said channel region, said first and second floating gates being separated from each other along a line extending in a direction parallel to the channel direction of said channel region;
   a control gate on said first and second floating gate;
   a first insulating layer disposed between the channel region and the first and second floating gates;
   a second insulating layer disposed between said first and second floating gates and said control gates; and
   third and fourth semiconductor regions respectively located below said first and second floating gates for producing a first electric field adjacent said first floating gate when said first and second semiconductor regions are biased at a first potential difference and for producing a second electric field adjacent said second floating gate when the first and second semiconductor regions are biased at a second potential difference inverse to the first potential difference.

2. A field effect transistor as claimed in claim 1, wherein said third semiconductor region is of the first conductivity type and located in said channel region adjacent said second semiconductor region, and said fourth semiconductor region is of the first conductivity type and located in said channel region adjacent said first semiconductor region, and wherein impurity concentration of said third and fourth semiconductor regions is higher than impurity concentration of said substrate.

3. A field effect transistor as claimed in claim 1, wherein an amount of electrons trapped in said first floating gate under the influence of said first electric field is different from an amount of electrons trapped in said second floating gate under the influence of said second electric field.

4. A field effect transistor as claimed in claim 3, wherein said first floating gate has a greater size than said second floating gate.

5. A field effect transistor as claimed in claim 3, wherein the first insulating layer has a greater thickness portion below said first floating gate and a smaller thickness portion below said second floating gate.

6. A field effect transistor as claimed in claim 1, wherein said first and second floating gates are of equal size.

7. A field effect transistor as claimed in claim 6, wherein a potential with which the first semiconductor region is biased to produce said first electric field is higher than a potential with which the second semiconductor region is biased to produce said second electric field.

8. A field effect transistor as claimed in claim 6, wherein potentials with which the first and second semiconductor regions are respectively biased to produce said first and second electric fields are equal to each other.

9. A field effect transistor as claimed in claim 4, wherein potentials with which the first and second semiconductor regions are respectively biased to produce said first and second electric fields are equal to each other.

10. A non-volatile memory comprising:
    an array of memory cells arranged on a semiconductor substrate of first conductivity type, each of said cells comprising:
    first and second semiconductor regions in said substrate, the first and second semiconductor regions having a second conductivity type opposite to the first conductivity type, and being arranged to form a channel region extending in a channel direction therebetween;
    first and second floating gates formed above said channel region, said first and second floating gates being separated from each other along a line extending parallel to the channel direction of said channel region;
    a control gate on said first and second floating gate;
    a first insulating layer disposed between the channel region and the first and second floating gates;
    a second insulating layer disposed between said first and second floating gates and said control gates; and
    third and fourth semiconductor regions respectively located below said first and second floating gates for producing a first electric field adjacent said first floating gate when said first and second semiconductor regions are biased at a first potential difference and for producing a second electric field adjacent said second floating gate when the first and second semiconductor regions are biased at a second potential difference inverse to the first potential difference.

11. A non-volatile memory as claimed in claim 10, wherein said third semiconductor region is of the first conductivity type and located in said channel region adjacent said second semiconductor region, and said fourth semiconductor region is of the first conductivity type and located in said channel region adjacent said first semiconductor region, and wherein impurity concentration of said third and fourth semiconductor regions is higher than impurity concentration of said substrate.

12. A non-volatile memory as claimed in claim 10, wherein an amount of electrons trapped in said first floating gate under the influence of said first electric field is different from an amount of electrons trapped in said second floating gate under the influence of said second electric field.

13. A non-volatile memory as claimed in claim 12, wherein said first floating gate has a greater size than said second floating gate.

14. A non-volatile memory as claimed in claim 12, wherein the first insulating layer has a greater thickness portion below said first floating gate and a smaller thickness portion below said second floating gate .

15. A non-volatile memory as claimed in claim 10, wherein said first and second floating gates are of equal size.

16. A non-volatile memory as claimed in claim 15, wherein a potential with which the first semiconductor region is biased to produce said first electric field is higher than a potential with which the second semiconductor region is biased to produce said second electric field.

17. A non-volatile memory as claimed in claim 13, wherein potentials with which the first and second semiconductor regions are respectively biased to produce said first and second electric fields are equal to each other.

18. A non-volatile memory as claimed in claim 14, wherein potentials with which the first and second semiconductor regions are respectively biased to produce said first and second electric fields are equal to each other.

19. A non-volatile memory as claimed in claim 10, further comprising:

a write circuit for producing a plurality of voltages;

a first selector for respectively coupling first and second voltages from the write circuit to the first and second semiconductor regions of a selected memory cell; and a second selector for coupling a third voltage from the write circuit to the control gate of the selected memory cell.

20. A non-volatile memory as claimed in claim 11, further comprising:

a write circuit for producing a plurality of voltages;

a first selector for respectively coupling first and second voltages from the write circuit to the first and second semiconductor regions of a selected memory cell; and a second selector for coupling a third voltage from the write circuit to the control gate of the selected memory cell.

* * * * *